United States Patent [19]
Kim

[11] Patent Number: 5,838,621
[45] Date of Patent: Nov. 17, 1998

[54] SPARE DECODER CIRCUIT

[75] Inventor: Dae-Sik Kim, Seoul, Rep. of Korea

[73] Assignee: LG Semicon Co., Ltd., ChungCheong Buk-Do, Rep. of Korea

[21] Appl. No.: 832,732

[22] Filed: Apr. 14, 1997

[30]     Foreign Application Priority Data

Apr. 12, 1996  [KR]   Rep. of Korea ................. 1996 11012

[51] Int. Cl.⁶ ............................................... G11C 7/00
[52] U.S. Cl. .......................... 365/200; 365/96; 365/226
[58] Field of Search ................................ 365/200, 201, 365/96, 226, 228

[56]            References Cited

U.S. PATENT DOCUMENTS

| | | | |
|---|---|---|---|
| 4,701,884 | 10/1987 | Aoki et al. ............................... | 365/200 |
| 4,734,889 | 3/1988 | Mashiko et al. ........................ | 365/200 |
| 5,282,165 | 1/1994 | Miyake et al. .......................... | 365/200 |
| 5,471,427 | 11/1995 | Murakami et al. ...................... | 365/200 |
| 5,479,371 | 12/1995 | Ootani ..................................... | 365/200 |
| 5,574,729 | 11/1996 | Kinoshita et al. ...................... | 371/10.3 |
| 5,652,725 | 7/1997 | Suma et al. ............................. | 365/200 |

*Primary Examiner*—Viet Q. Nguyen
*Attorney, Agent, or Firm*—Loudermilk & Associates

[57]            ABSTRACT

A spare decoder circuit generates a redundancy signal which accesses a redundancy cell on behalf of a failed cell when an input address for repairing the failed cell accesses the failed cell in a memory device having a redundancy cell. The spare decoder circuit includes: a first programming part which includes a first signal line for generating a redundancy signal; first enabling means for providing a constant electric potential to the first signal line; and first programming cells which are connected to an address line and control an electric potential of the first signal line; and a second programming part which includes: a second signal line for generating a redundancy signal; second enabling means for providing a constant electric potential to the second signal line; and second programming cells which are connected to an address line, and controls an electric potential of the second signal line.

19 Claims, 7 Drawing Sheets

SPARE DECODER CIRCUIT

FIELD OF THE INVENTION

The present invention relates to spare decoder circuits for devices having redundancy cells, and more particularly to spare decoder circuits that reduce the number of fuses disconnected in a spare decoder circuit for generating a redundancy signal.

BACKGROUND OF THE INVENTION

In general, it is difficult to perform a perfect manufacturing process for semiconductor devices. Accordingly, in a dynamic random access memory (hereinafter referred to as a DRAM), a few memory cells may have a poor condition after manufacturing, with the result that the memory device may need to be entirely discarded. In such situations, a number of spare cells, often called redundancy cells, may be made in proper numbers simultaneously with forming the main memory cells, so that spare cells may substitute for failed cells of the main memory, thereby resulting in a fully functional DRAM.

If there is an address for the DRAM accessing a poor main memory cell, a redundancy cell is accessed by the spare decoder circuit, thereby "repairing" the failed cell. The spare decoder circuit (i.e., a redundancy circuit) generates a redundancy signal (i.e., a redundancy detecting signal or redundancy control signal) using a spare decoder composed of both an n-channel metal-oxide semiconductor (hereinafter referred to as NMOS) device and a fuse. The redundancy cell is accessed by this redundancy signal.

FIG. 1 illustrates a conventional spare decoder circuit for repairing a failed cell. Referring to FIG. 1, gates of P-channel MOS (hereinafter referred to as PMOS) and NMOS transistors 12 are connected to addresses AI and AIB (i.e., a bar or complement address of AI) of address lines 10, which applies a repair address of a redundancy cell substituted for a failed cell of a main memory cell block. Sources and drains of transistors 12 are grounded as illustrated. Drains of NMOS transistors are connected to first redundancy control line 16-1 through fuses 13, and sources of PMOS transistors are connected to second redundancy control line 16-2 through fuses 13, for coding the repair address. A voltage level state of the redundancy control signal line is output through redundancy selector 14 and redundancy detector 15. A constant level power supply is applied to the redundancy control signal line through an inverter element.

In order to code the repair address, fuses connected to an address line for which a bit of the repair address is at a high level are disconnected. Accordingly, when there is a repair address in the address line, NMOS transistors are turned on. But since the fuse is disconnected, the NMOS transistors cannot be connected to control signal line 16-1.

When the control signal line is not connected to ground Vss and maintains a constant voltage level, selecting signals (SPS1-R, SPS2-R, SPS1-L, and SPS2-L) for selecting a redundancy cell are output, and RD signal which disables a main decoder and enables a spare decoder so as to select the redundancy cell is generated. Selecting signals (SPS1-R, SPS2-R, SPS1-L, and SPS2-L) selecting the redundancy cell are used as a signal for driving a word line or a bit line.

By way of example for repair coding, in case A1 wherein an address of a failed cell is <01111111> and A2 wherein an address of a failed cell is <11100000>, eight fuses connected to AIB[8] and AI[1–7] should be disconnected so as to code the A1 case, and eight fuses connected to AI[6–8] and AIB[1–5] should be disconnected so as to code the A2 case. That is, fuses of bits having a high value of a failed cell address bit are disconnected.

Therefore, when the failed cell address is input, a voltage state (i.e., high) of the control signal line cut off from the ground is output so as to select the redundancy cell, so that the redundancy cell outputs data. On the other hand, when a high address is applied to any one of transistors 12 of which fuses 13 are not disconnected, through address line 10, the transistor receiving the high address is turned on. Since control lines 16-1 and 16-2 are connected to ground Vss, a voltage level becomes a ground potential. As a result, selecting signals (SPS1-R, SPS2-R, SPS1-L, and SPS2-L) are not output, and the RD signal which disables the main decoder and enables the spare decoder so as to select the redundancy cell is not output, so that the main decoder operates normally.

The conventional repair method of a device having a redundancy cell codes an address of a fail cell by using a spare decoder composed of both an MOS transistor and a fuse, and selects a redundancy cell. In this conventional method, fuses wherein a bit value of the repair address is high should be disconnected. In case of disconnecting a number of fuses, the probability of generating a short to an adjacent line increases due to particles produced by disconnecting the fuse. Due to a disconnection of a number of fuses, the chip's stress increases and a disconnection working also increases, thereby decreasing production yield.

SUMMARY OF THE INVENTION

Accordingly, the present invention is directed to a spare decoder circuit that substantially obviates one or more of the problems due to limitations and disadvantages of the related art.

It is an object of the present invention to provide a spare decoder circuit for generating a redundancy signal which accesses a redundancy cell on behalf of a failed cell when an input address for repairing the failed cell accesses the failed cell in a memory device having a redundancy cell.

In order to achieve this object, the spare decoder circuit includes:

a first programming part including: a first signal line for generating a redundancy signal; first enabling means for providing a constant electric potential to the first signal line; and first programming cells which are connected to an address line and control an electric potential of the first signal line; and a second programming part including: a second signal line for generating a redundancy signal; second enabling means for providing a constant electric potential to the second signal line; and second programming cells which are connected to an address line and control an electric potential of the second signal line.

The first and second enabling means include:

a fuse of which one terminal is connected to a power supply; and a logic circuit which is connected to an enabling signal with the other terminal of the fuse, and generates a low level potential when the fuse is connected to the power supply without a disconnection, and generates a high level potential when the fuse is disconnected and the enabling signal is applied.

The logic circuit includes:

a resistive switching element which is connected to the other terminal of the fuse, and connects the other terminal of the fuse to a ground when applying the enabling signal;

a first inverter which is connected to the other terminal of the fuse;

a third NMOS transistor of which the gate terminal is connected to an output terminal of the first inverter, and of which drain and source terminals are connected between the other terminal of the fuse and a reference electric potential;

a second inverter connected to the output terminal of the first inverter;

a NOR gate of which input terminal is connected to an output terminal of the second inverter; and a third inverter of which input terminal is connected to the enabling signal line, and of which output terminal is connected to the other input terminal of the NOR gate.

When the fuse is not disconnected, the output signal of the NOR gate is always at a low level regardless of a state of enabling signal X/Y. When the fuse is disconnected, the output of the NOR gate is changed according to the state of enabling signal X/Y.

BRIEF DESCRIPTION OF THE ATTACHED DRAWINGS

The preferred embodiments of the present invention will now be described more specifically with reference to the attached drawings, wherein.

DETAILED DESCRIPTION OF THE INVENTION

Reference will now be made in greater detail to certain preferred embodiments of the present invention, examples of which are illustrated in the accompanying drawings.

Figure 2:
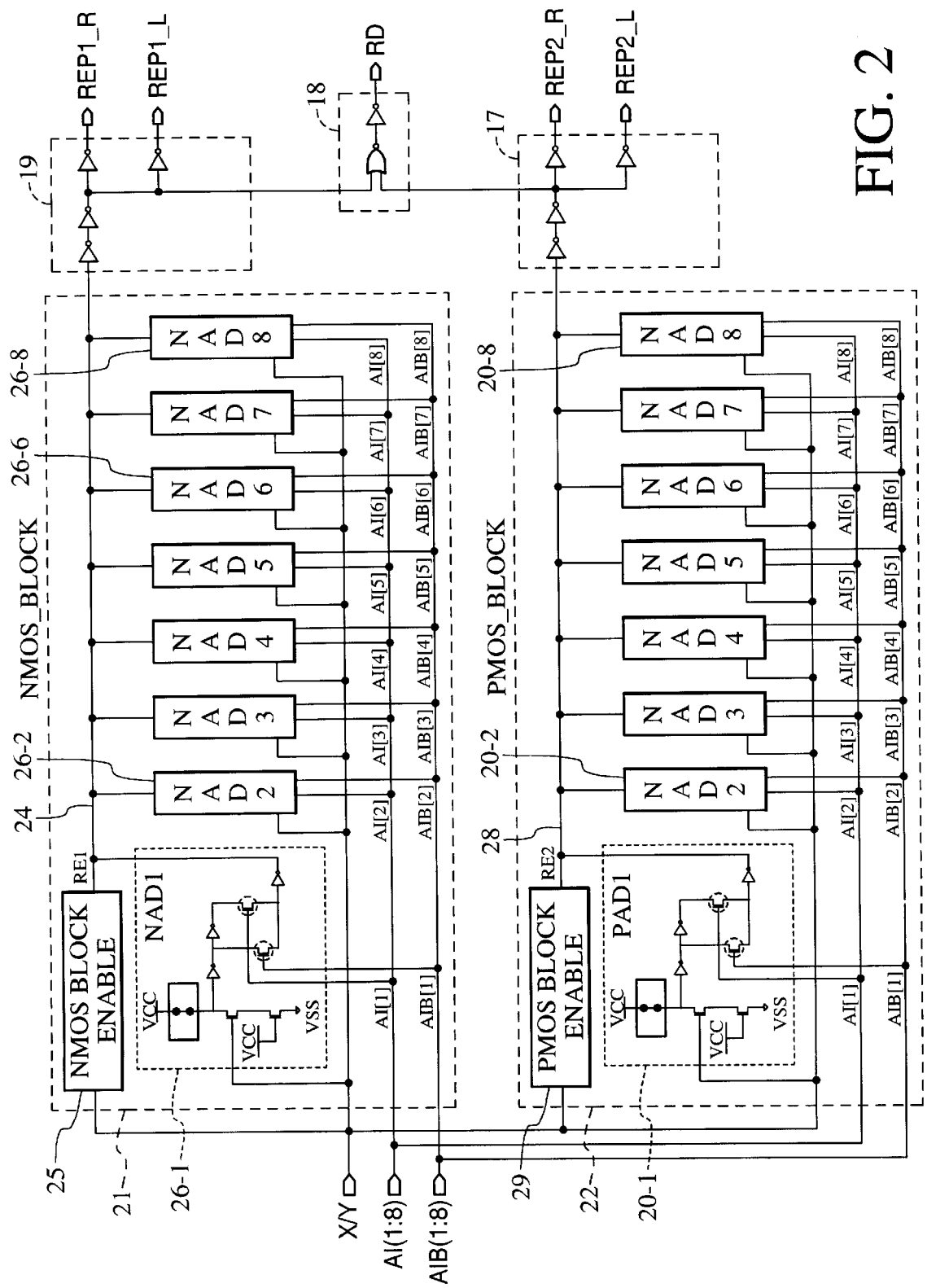
FIG. 2 illustrates a spare decoder circuit in accordance with a preferred embodiment of the present invention.

FIG. 2 is a block diagram illustrating a spare decoder circuit for coding a repair (or failed cell) address.

The spare decoder circuit includes: first programming part 21 (i.e., NMOS block) composed of NMOS transistors; second programming part 22 (i.e., PMOS block) composed of PMOS transistors; and repair detector 18.

First programming part 21 includes: first signal line 24 for generating a redundancy signal; first enabling means 25 which receives enabling signal X/Y as an input, and provides a constant electric potential to first signal line 24; and a plurality of programming cells 26 connected to first signal line 24.

Second programming part 22 includes: second signal line 28 for generating a redundancy signal; second enabling means 29 which receives enabling signal X/Y as an input, and provides a constant electric potential to second signal line 28; and a plurality of programming cells 20 connected to second signal line 28.

The programming cells have two input terminals and one output terminal. The two input terminals are connected to AI and AIB lines of the repair address. The output terminal of the first programming part is connected to the first signal line. The output terminal of the second programming part is connected to the second signal line.

As for enabling signal X/Y, signal 'X' is generated by control of /RAS signal being a row address strobe signal when the spare decoder circuit of the present invention is used for repairing a row address. Signal 'Y' is generated by control of /CAS signal being a column address strobe signal when the spare decoder circuit of the present invention is used for repairing a column address.

Repair detector 18 is connected to first signal line 24 and second signal line 28, and is composed of logic gates which generate a redundancy detecting signal according to the voltage level states of two signal lines 24 and 28.

In addition, first output part 19 for outputting selecting signals REP1_R and REP1_L selecting the redundancy cell according to the voltage level of first signal line 24, is connected to first signal line 24. Second output part 17 for outputting selecting signals REP2_R and REP2_L selecting the redundancy cell according to the voltage level of second signal line 28, is connected to second signal line 28.

Figure 3:
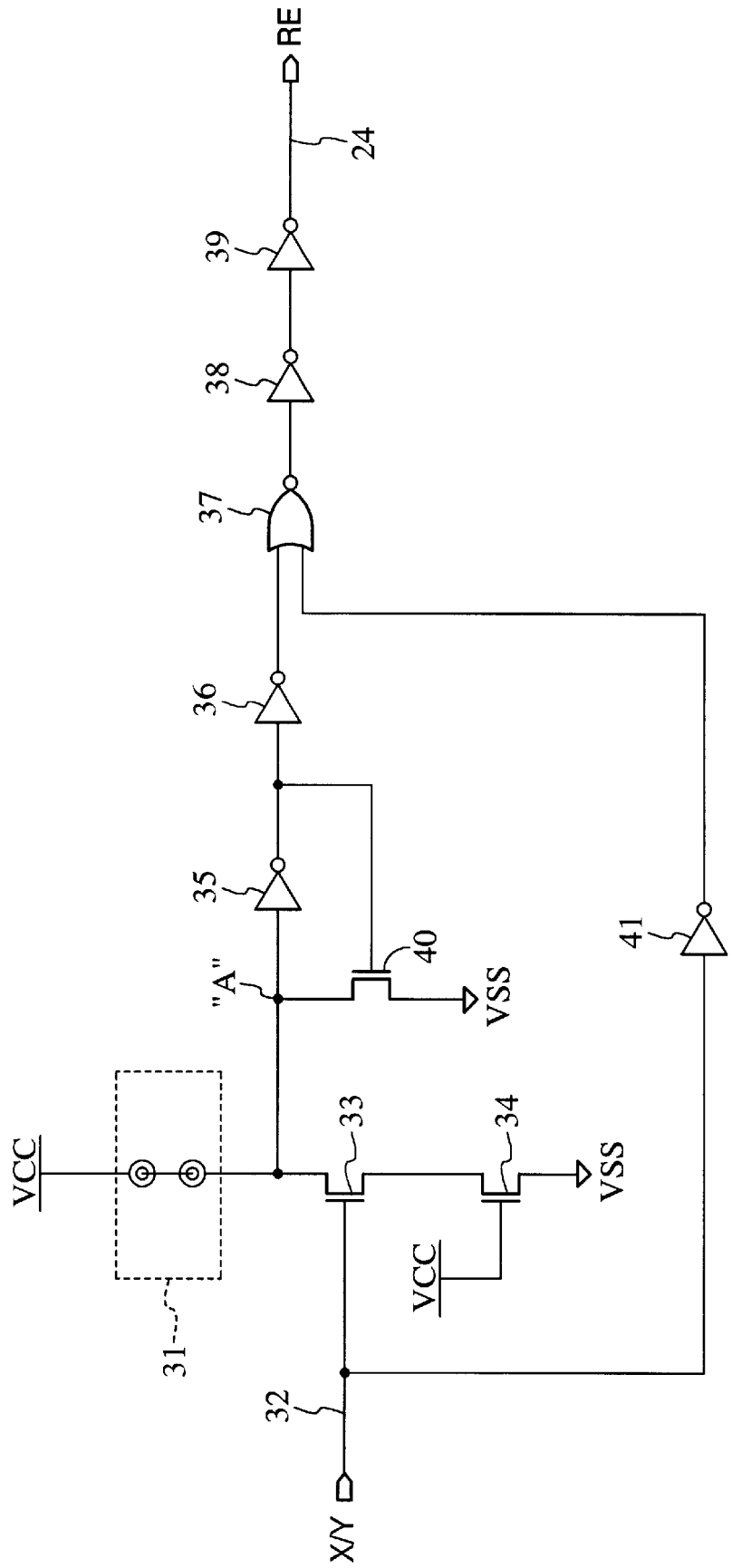
FIG. 3 is a circuit diagram of an enabling means in accordance with a preferred embodiment of the present invention.

FIG. 3 is a circuit diagram of an embodiment of the enabling means.

As illustrated in FIG. 3, the first enabling means includes: fuse 31 of which one terminal is connected to Vcc; first NMOS transistor 33 of which gate is connected to enabling signal X/Y 32, and of which drain is connected to the other terminal of fuse 31; second NMOS transistor 34 of which gate is connected to Vcc, and of which drain and source are connected between a source of first NMOS transistor 33 and a reference electric potential; first inverter 35 connected to the other terminal of the fuse; third NMOS transistor 40 of which gate is connected to an output terminal of first inverter 35, and of which drain and source are connected between the other terminal of the fuse and the reference electric potential; second inverter 36 connected to the output terminal of first inverter 35; NOR gate 37 for receiving an output signal of second inverter 36 as an input; third inverter 41 of which one terminal is connected to enabling signal line 32, and of which other terminal is connected to NOR gate 37; and fourth and fifth inverters 38 and 39 connecting an output signal of NOR gate 37 to first redundancy signal line 24.

The second enabling means is similar to the first enabling means illustrated in FIG. 3. The second enabling means connects an output signal of fifth inverter 39 to second redundancy signal line 28.

When fuse 31 is not disconnected, output signal RE of the enabling means is always at a low level by Vcc irrespective of X/Y signal of enabling signal line 32, because node "A" is always at a high level.

When fuse 31 is disconnected, output signal RE of the enabling means is changed according to a state of enabling signal X/Y 32. That is node "A" is at a low level when the enabling signal is at a high level. The output signal of third inverter 41 is at a high level irrespective of node "A" when the enabling signal is at a low level, output signal of NOR gate 37 is at a low level and is output through inverters 38 and 39.

Therefore, if the enabling signal is at a high level when the fuse is disconnected, the enabling means becomes an enabling state; that is, the output of the enabling means becomes a high level.

Enabling means 25 and 29 and repair detector 18 may be comprised by using various other circuit elements. Output parts 17 and 19 similarly may be comprised by using other elements.

Repair detector 18 is comprised of logic circuits such as NOR and NAND gates. If a repair function is performed in any block between NMOS and PMOS blocks, repair detector 18 is designed to output repair detecting signal RD.

Figure 4:
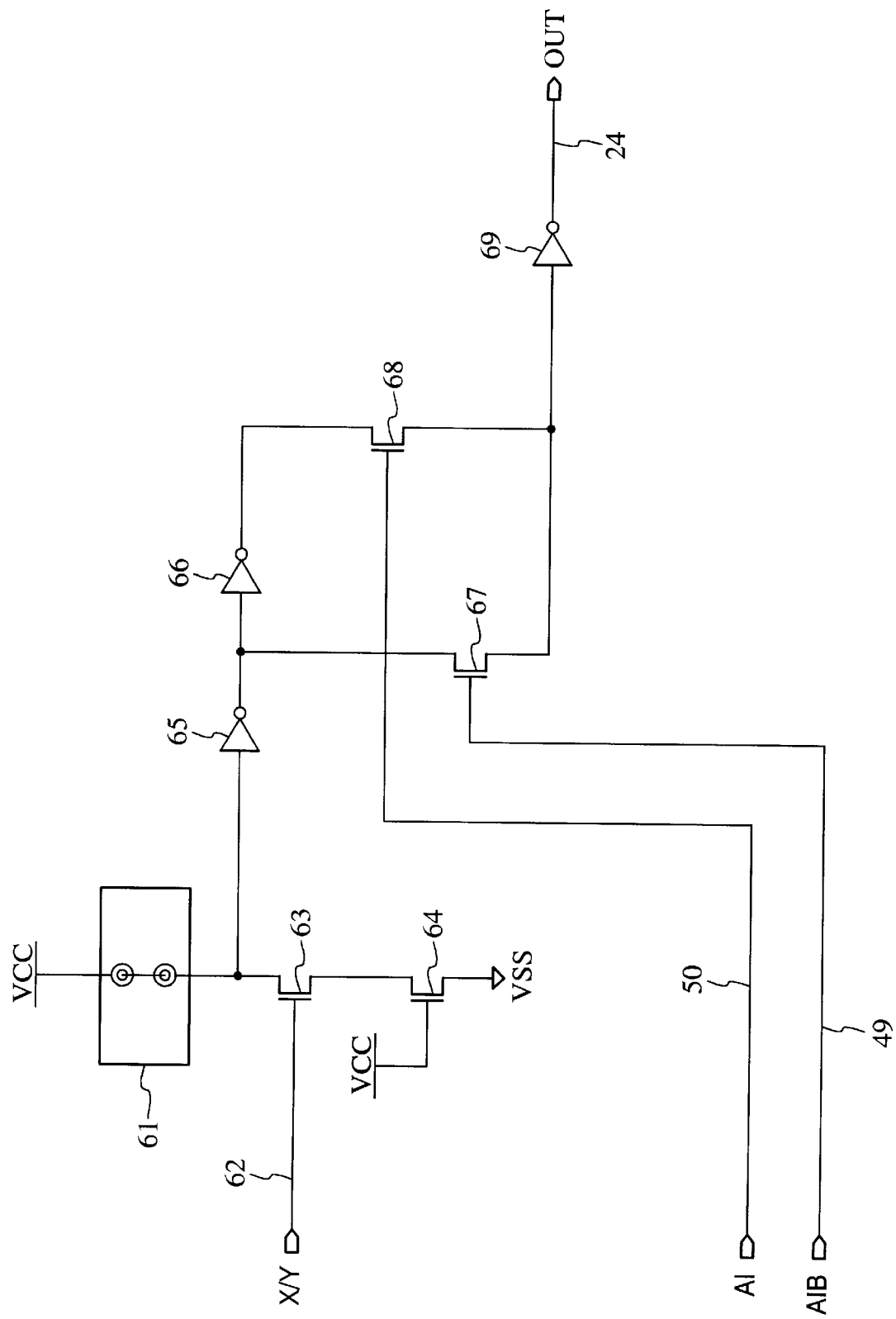
FIG. 4 is a circuit diagram of a first programming cell.

FIG. 4 is a circuit diagram illustrating first programming cells 26 of first programming part 21, being an NMOS block.

First programming cell 26 includes, as illustrated: fuse 61 of which one terminal is connected to Vcc; fourth NMOS transistor 63 of which gate is connected to enabling signal X/Y 62, and of which drain is connected to the other terminal of fuse 61; fifth NMOS transistor 64 of which gate is connected to Vcc, and of which drain and source are connected between a source of fourth NMOS transistor 63 and a reference electric potential; sixth inverter 65 connected to the other terminal of the fuse; sixth NMOS transistor 67 of which drain is connected to an output terminal of sixth inverter 65, and of which gate is connected to AIB line 49 of a repair address; seventh inverter 66 for receiving the output signal of sixth inverter 65 as an input; seventh NMOS transistor 68 of which drain is connected to an output terminal of seventh inverter 66, of which gate is connected to AI line 50 of the repair address, and of which source is connected to a source of sixth NMOS transistor 67; and eighth inverter 69 of which input terminal is connected to sources of sixth and seventh NMOS transistors, and of which output terminal is connected to redundancy signal line 24.

Figure 5:
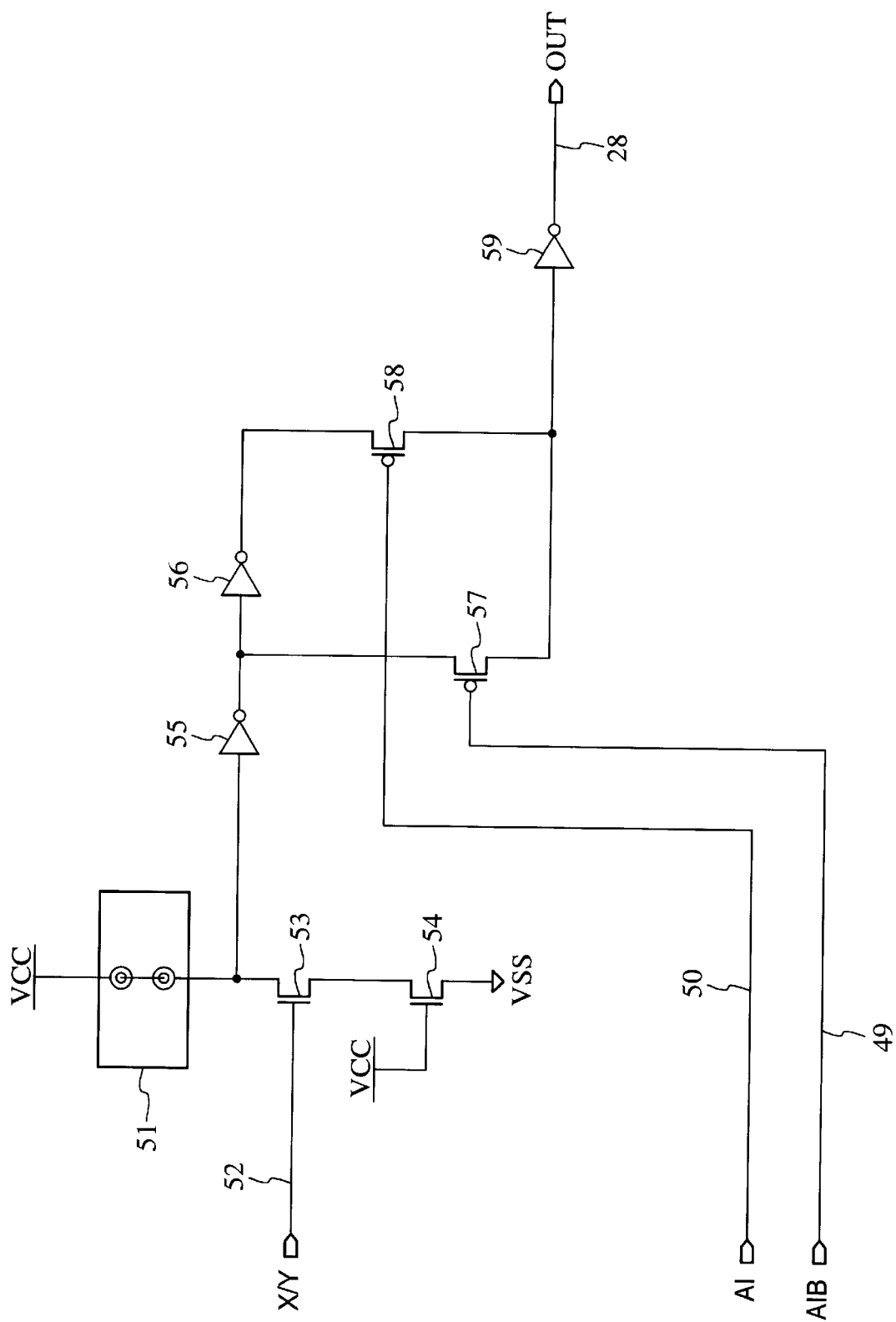
FIG. 5 is a circuit diagram of a second programming cell.

FIG. 5 is a circuit diagram illustrating second programming cell 20 of second programming part 22 being a PMOS block.

In second programming cell 20, the sixth and seventh NMOS transistors of first programming cell 26 in the NMOS block are changed to PMOS transistors.

Second programming cell 20 includes, as illustrated: fuse 51 of which one terminal is connected to Vcc; fourth NMOS transistor 53 of which gate is connected to enabling signal X/Y 52, and of which drain is connected to the other terminal of fuse 51; fifth NMOS transistor 54 of which gate is connected to Vcc, and of which drain and source are connected between a source of fourth NMOS transistor 53 and a reference electric potential; sixth inverter 55 connected to the other terminal of fuse 51; sixth PMOS transistor 57 of which drain is connected to an output terminal of sixth inverter 55, and of which gate is connected to AIB line 49 of a repair address; seventh inverter 56 for receiving the output signal of sixth inverter 55 as an input; seventh PMOS transistor 58 of which drain is connected to an output terminal of seventh inverter 56, of which gate is connected to AI line 50 of the repair address, and of which source is connected to a source of sixth PMOS transistor 57; and eighth inverter 59 of which input terminal is connected to sources of the sixth and seventh PMOS transistors, and of which output terminal is connected to redundancy signal line 24.

Operation of the first and second programming cells when signal X/Y is at a high level are described in Tables 1 and 2 being truth tables as follows:

TABLE 1

| Fuse Not Cut | | | Fuse Cut | | |
|---|---|---|---|---|---|
| AI | AIB | OUT | AI | AIB | OUT |
| 1 | 0 | 0 | 1 | 0 | 1 |
| 0 | 1 | 1 | 0 | 1 | 0 |

TABLE 2

| Fuse Not Cut | | | Fuse Cut | | |
|---|---|---|---|---|---|
| AI | AIB | OUT | AI | AIB | OUT |
| 1 | 0 | 1 | 1 | 0 | 0 |
| 0 | 1 | 0 | 0 | 1 | 1 |

Operation of the first programming cell is described in Table 1. Since enabling signal X/Y 62 is at a high state in case of a fuse not cut state, fourth NMOS transistor 63 is turned on, and fifth NMOS transistor 64 of which gate is connected to Vcc is also turned on. Although the fourth and fifth NMOS transistors are turned on, they serve as a resistor of a certain sort. Accordingly, a voltage level of Vcc is applied to the input terminal of sixth inverter 65 through fuse 61, and the output signal of sixth inverter 65 is at a low level.

A gate of sixth NMOS transistor 67 is connected to AIB line 49 of the repair address, and a gate of seventh NMOS transistor 68 is connected to AI line 50 of the repair address. When AIB line 49 is at a high level, AI line 50 is at a low level. On the contrary, when AIB line 49 is at a low level, AI line 50 is at a high level. Accordingly, two lines 49 and 50 are alternatively turned on, and are not turned on at the same time.

When the AIB line of the repair address is at a high level, sixth NMOS transistor 67 is turned on, and seventh NMOS transistor 68 is turned off. Accordingly, the input signal of eighth inverter 69 is at a low level, and a high level signal is generated in redundancy signal line 24 connected to the output terminal of the eighth inverter.

On the other hand, when the AI line of the repair address is at a high level, sixth NMOS transistor 67 is turned off, and seventh NMOS transistor 68 is turned on. Accordingly, the output signal having a low level of sixth inverter 65 is reversed to a high level signal, and the input signal of eighth inverter 69 is at a high level. As a result, a low level signal is generated in redundancy signal line 24 connected to the output terminal of the eighth inverter.

In light of the fuse cut state, since enabling signal X/Y 52 is at a high state, fourth NMOS transistor 63 is turned on and fifth NMOS transistor 64 of which gate is connected to Vcc is also turned on. Since fuse 61 is disconnected, the input signal of sixth inverter 65 is at a low level, and the output signal of sixth inverter 65 is at a high level.

When the AIB line of the repair address is at a high level, sixth NMOS transistor 67 is turned on, and seventh NMOS transistor 68 is turned off. Accordingly, the input signal of eighth inverter 69 is at a high level, and low level signal 10 is generated in redundancy signal line 24 connected to the output terminal of eighth inverter 69.

On the contrary, when the AI line of the repair address is at a high level, sixth NMOS transistor 67 is turned off, seventh NMOS transistor 68 is turned on, and the input signal of eighth inverter 69 is at a low level. As a result, a high level signal is generated in redundancy signal line 24 connected to the output terminal of eighth inverter 69.

In the meantime, operation of second programming cell 20 is described in Table 2. Since enabling signal X/Y 52 is at a high state in a fuse not cut state, fourth NMOS transistor 53 is turned on, and fifth NMOS transistor 54 of which gate is connected to Vcc is also turned on. Although the fourth and fifth NMOS transistors are turned on, they serve as a resistor of a certain sort. Accordingly, a voltage level of Vcc is applied to the input terminal of sixth inverter 55 through fuse 51, and the output signal of sixth inverter 55 is at a low level.

A gate of sixth PMOS transistor 57 is connected to AIB line 49 of the repair address, and a gate of seventh PMOS transistor 58 is connected to AI line 50 of the repair address. When AIB line 49 is at a high level, AI line 50 is at a low level. On the contrary, when AIB 49 is at a low level, the AI line is at a high level. Accordingly, two lines 49 and 50 are alternatively turned on, and are not turned on at the same time.

When the AIB line of the repair address is at a high level, sixth PMOS transistor 57 is turned off and seventh PMOS transistor 58 is turned on. Accordingly, the input signal of eighth inverter 59 is at a high level, and the output signal of eighth inverter 59 is at a low level. That is, the low level signal is generated in redundancy signal line 28.

On the other hand, when the AI line of the repair address is at a high level, sixth PMOS transistor 57 is turned on, and seventh PMOS transistor 58 is turned off, and the input signal of eighth inverter 59 is at a low level. As a result, a high level signal is generated in redundancy signal line 28 connected to the output terminal of eighth inverter 59.

In the light of the fuse cut state, since enabling signal X/Y 52 is at a high state, fourth NMOS transistor 53 is turned on, and fifth NMOS transistor 54 of which gate is connected to Vcc is also turned on. Since fuse 51 is disconnected, the input signal of the sixth inverter is at a low level, and the output signal of sixth inverter 55 is at a high level.

When the AI line of the repair address is at a high level, sixth PMOS transistor 57 is turned on, seventh PMOS transistor 58 is turned off, and the input signal of eighth inverter 59 is at a high level. As a result, a low level signal is generated in redundancy signal line 28 connected to the output terminal of eighth inverter 59.

On the contrary, when the AIB line of the repair address is at a high level, sixth PMOS transistor 57 is turned off, seventh PMOS transistor 58 is turned on, and the input signal of eighth inverter 59 is at a low level. As a result, a high level signal is generated in redundancy signal line 28 connected to the output terminal of eighth inverter 59.

Figure 7:
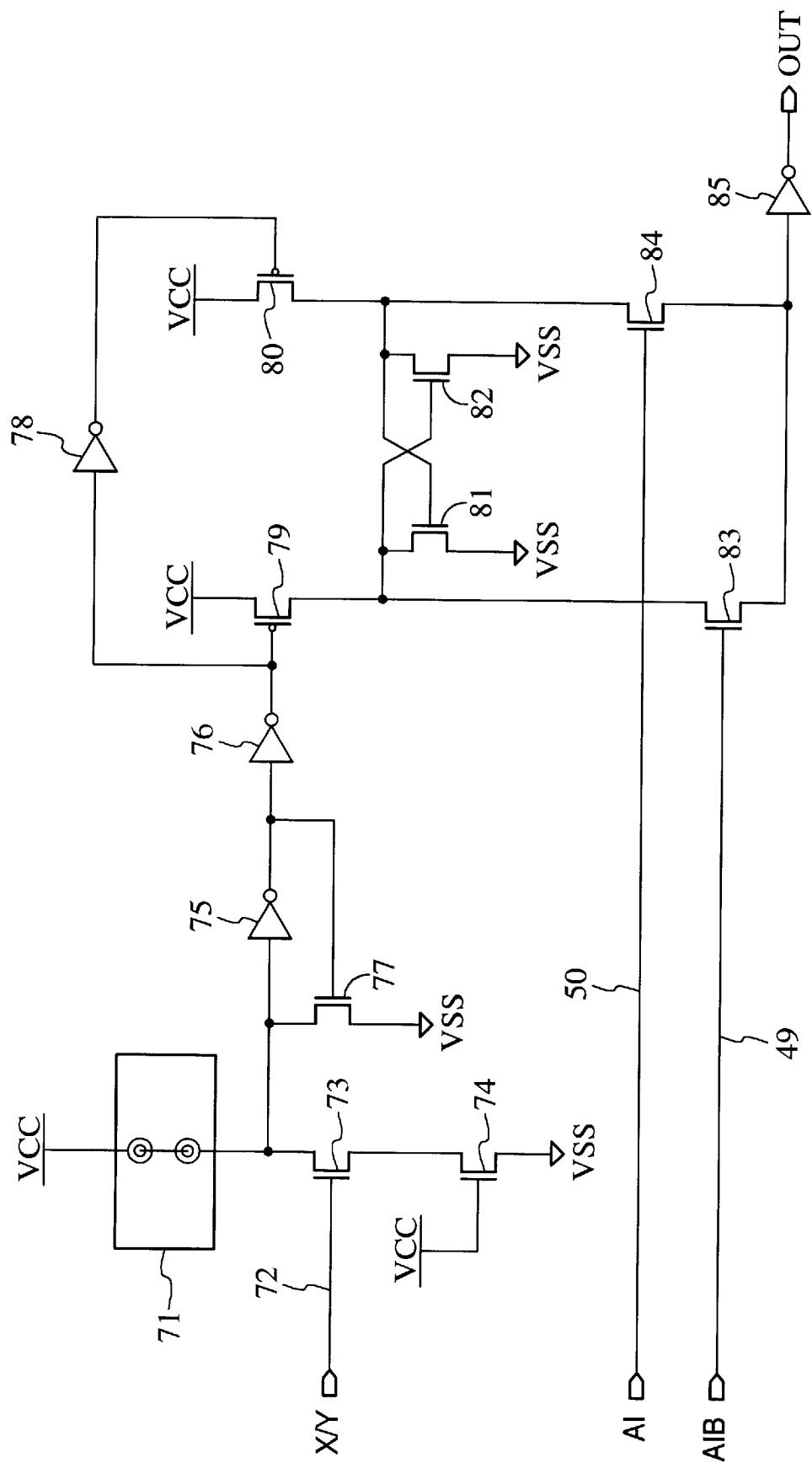
FIG. 7 is a circuit diagram illustrating another preferred embodiment of the first programming cell.

FIG. 7 illustrates another preferred embodiment of the first programming cell.

Referring to FIG. 7, first programming cell 26 includes: fuse 71 of which one terminal is connected to Vcc; fourth NMOS transistor 73 of which gate is connected to enabling signal X/Y 72, and of which drain is connected to the other terminal of fuse 71; fifth NMOS transistor 74 of which gate is connected to Vcc, and of which drain and source are connected between a source of fourth NMOS transistor 73 and a reference electric potential; sixth NMOS transistor 83 of which gate is connected to AIB line 49 of a repair address; seventh NMOS transistor 84 of which gate is connected to AI line 50 of the repair address; sixth inverter 75 connected to the other terminal of fuse 71; eighth NMOS transistor 77 of which gate is connected to an output terminal of sixth inverter 75, and of which drain and source are connected between fuse 71 and the reference electric potential; seventh inverter 76 for receiving the output signal of sixth inverter 75 as an input; ninth PMOS transistor 79 of which gate is connected to an output terminal of the seventh inverter, and of which source is connected to Vcc; eighth inverter 78 of which input terminal is connected to the output terminal of seventh inverter 76; tenth PMOS transistor 80 of which gate is connected to an output terminal of eighth inverter 78, and of which source is connected to Vcc; eleventh NMOS transistor 81 of which gate is connected to a drain of tenth PMOS transistor 80, and of which drain is connected to drains of ninth PMOS transistor 79 and sixth NMOS transistor 83; twelfth NMOS transistor 82 of which gate is connected to the drain of ninth PMOS transistor 79, and of which drain is connected to drains of tenth PMOS transistor 80 and seventh NMOS transistor 84: and ninth inverter 85 for receiving source signals of both sixth NMOS transistor 83 and seventh NMOS transistor 84 as one input.

In second programming cell 20 of another preferred embodiment, sixth and seventh NMOS transistors of first programming cell 26 illustrated in FIG. 7 are changed to PMOS transistors. The second programming cell is not illustrated in detail.

The first and second programming cells are operated according to truth tables illustrated in Tables 1 and 2.

In another preferred embodiment, in order to certainly determine the high or low level state of a power supply applied to drains of both sixth NMOS transistor 83 and seventh NMOS transistor 84, ninth and tenth PMOS transistors and eleventh and twelfth NMOS transistors are further added.

Accordingly, if ninth and tenth PMOS transistors and eleventh and twelfth NMOS transistors are omitted, operation of the programming cells of another preferred embodiment may be identical with that of programming cells illustrated in FIGS. 4 and 5.

To code the repair address by using the spare decoder circuit of the present invention, in case the number of high bits is few in a failed address indicating a failed main cell, the fuse of first enabling means 25 operating as the enabling means of NMOS block is disconnected, so that the first enabling means is enabled. The repair address is coded by cutting the fuse of the programming cell connected to the address line responsive to a high bit of address of NMOS block 21. In case the number of low bits is few, the repair address is enabled by cutting the fuse of second enabling means 29 in PMOS block. Furthermore, the repair address is coded by cutting the fuse of the programming cell connected to the address line responsive to a low bit of the repair address of PMOS block 22.

NMOS block 21 or PMOS block 22 of the spare decoder circuit is selected according to a bit state of the repair address, and is then programmed, thereby reducing the number of fuses disconnected.

Figure 1:
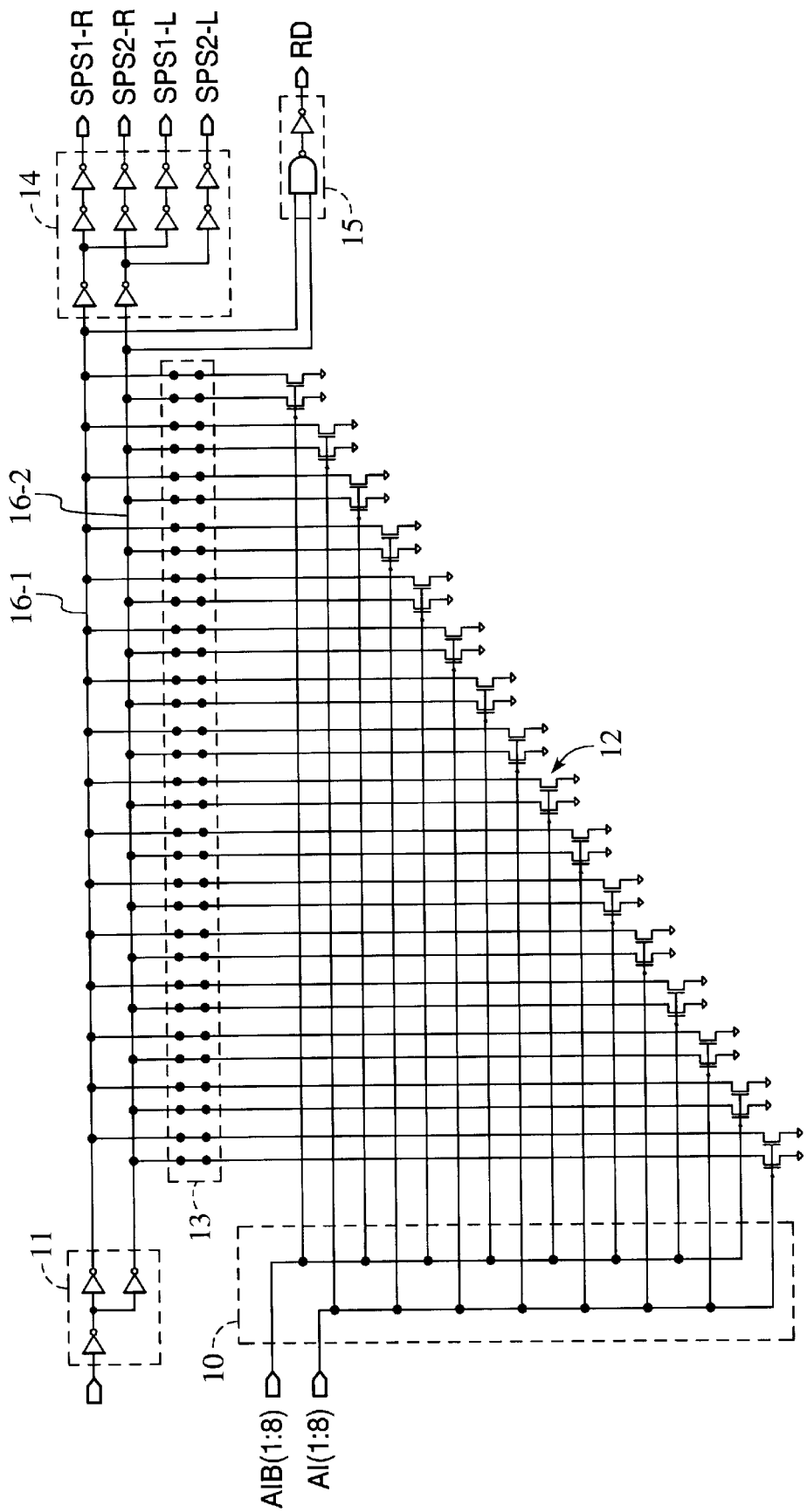
FIG. 1 illustrates a conventional spare decoder circuit.

By way of example, in case of coding both A1 of which repair address (i.e., a failed address) is <01111111> and A2 of which repair address is <11100000>, according to a conventional method illustrated in FIG. 1, eight fuses connected to AIB [8] and AI[1–7] should be disconnected so as to code the A1 case, and eight fuses connected to AI [6–8] and AIB[1–5] should be disconnected so as to code the A2 case.

According to the present invention illustrated in FIG. 2, in case of coding failed address A1, a coding of the failed address is finished by cutting both one fuse of second enabling means 29 of PMOS block 22 and one fuse of the programming cell connected to the address line responsive to AI [8] of PMOS block 22. In addition, in case of coding failed address A2, a coding of the fail address is finished by cutting both one fuse of first enabling means 25 of NMOS block 21 and three fuses of the programming cell connected to the address line responsive to AI [6–8] of NMOS block 21.

Accordingly, the present invention greatly reduces the number of fuses disconnected as compared with the conventional method, and attains the same repair operation as the conventional method.

Operation of the repair decoder circuit of the present invention will be described by two cases, i.e., a case in which a spare decoder is used for repairing a row address and another case in which the spare decoder is used for repairing a column address.

Figure 6A:
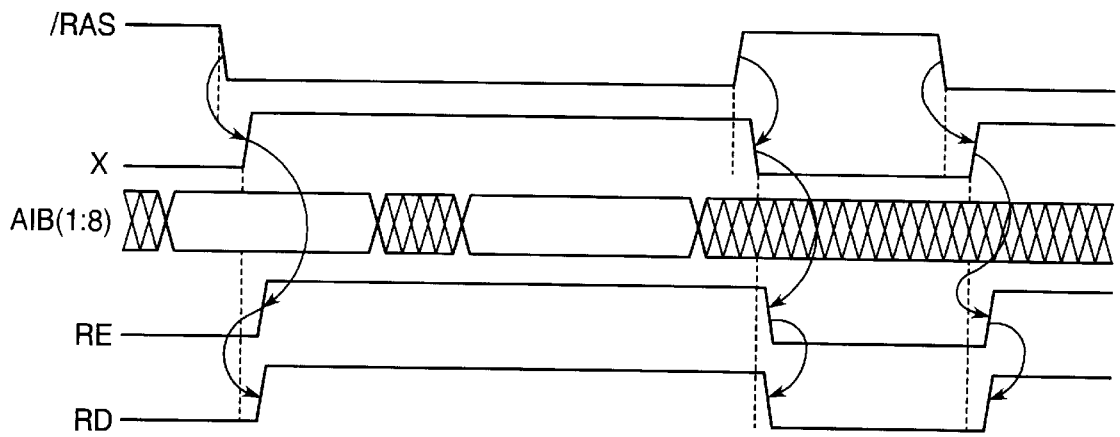
FIGS. 6A and 6B are timing diagrams for embodiments of the present invention.
Figure 6B:
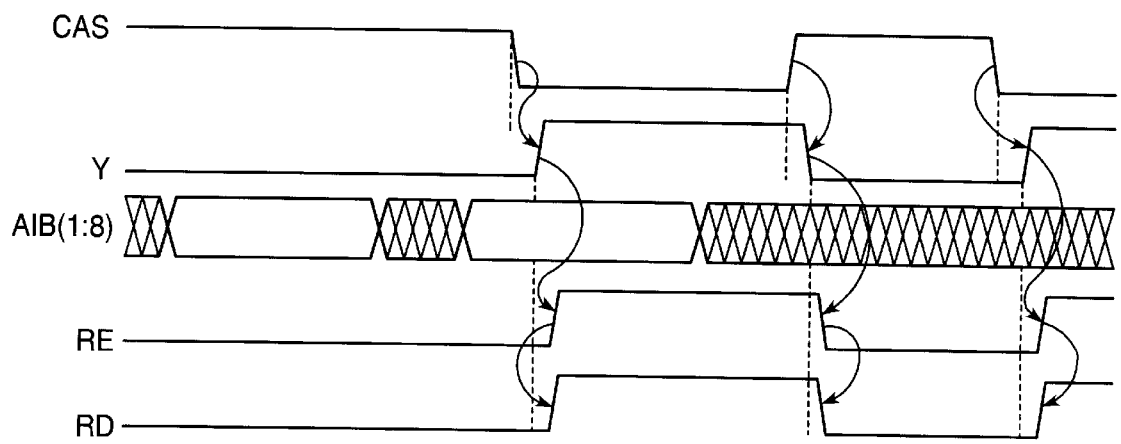

As illustrated in FIG. 6A, to repair the row address, row address strobe signal /RAS is at a low level then enabling signal X is at a high level. Accordingly, output signal RE of the enabling means is at a high level, and a high level voltage is applied to signal line 24 or 28.

At this time, when the number of high bits of the repair address are less than the number of low bits of the repair address, a low address is connected to the first programming cells because first programming part 21 is coded. The output signal of the programming cell connected to AI having a high state is at a high level, because the fuse is disconnected and AI is at a high level and AIB is at a low level. In addition, the output signal of the programming cell connected to AI not having a high state is at a high level, because the fuse is not disconnected and AI is at a low level and AIB is at a high level. That is, since the output signals of all programming cells are at a high level, electric potential of the redundancy signal line (i.e., the first signal line) is maintained as a high level state. Therefore, an RD signal having a high level is output through repair detector 18. When the RD signal is at a high level, a main address decoder is disabled and a redundancy cell corresponding to the repair address is accessed.

In addition, when the number of high bits of the repair address are more than the number of low bits of the repair address that is, when the number of low bits are less, a low address is connected to the second programming cells because second programming part 22 is enabled. The output signal of the programming cell connected to AI having a high state is at a high level, because the fuse is disconnected and AI is at a high level and AIB is at a low level. In addition, the output signal of the programming cell connected to AI not having a high state is at a high level, because the fuse is not disconnected and AI is at a low level and AIB is at a high level. That is, since the output signals of all programming cells are at a high level, electric potential of the redundancy signal line (i.e., the first signal line) is maintained as a high level state. Therefore, an RD signal having a high level is output through repair detector 18.

To repair a column address, signal "Y" operating as an enabling signal of enabling means 25 and 29 is applied by controlling column address strobe signal /CAS, and is then enabled. Except the above-mentioned operation, it will be understood that the remaining operations of the column address are identical with the repairing operations of the row address.

Repair detector 18 generating the RD signal is identical with the same of the conventional method. That is, if a repairing function is performed in any block between NMOS and PMOS blocks, repair detector 18 generates repair detecting signal RD.

The reason why the enabling means has a fuse is as follows. In case of two failed cells, each address is coded to the first and second programming parts. In case of one failed cell, that is, in case only one cell has a poor condition, after judging figures of the high bit of its fail address, only one programming part between the first and second programming parts is used in coding. Accordingly, a circuit which stops operating a remaining programming part is required. Without such a circuit, a malfunction may occur in the programming part which is not coded.

Assuming that there is no enabling means, in case that all failed addresses are high bits, a programming seems to be possible by using PMOS programming part, without cutting the fuse. Since address of which all bits are at a low level passes through the NMOS programming part, a malfunction occurs. In this case, the enabling means may be used to perform a normal function.

By using the spare decoder having two address paths according to the present invention, the address path can be selected according to the address when coding the repair address, thereby reducing the number of the fuses disconnected.

As described above, reducing the number of the fuses disconnected decreases the stress applied to a chip in cutting the fuse, decreases a short-generation probability between an adjacent line and the disconnected fuse by a disconnected particles of the fuse, and thereby enhances the production yield of the chip.

Although various preferred embodiments of the present invention have been disclosed for illustrative purposes, those skilled in the art will appreciate that various modifications, additions and/or substitutions are possible without departing from the scope and spirit of the present invention as disclosed in the claims.

What is claimed is:

1. A spare decoder circuit for generating a redundancy signal for accessing a redundancy cell in response to an address of a failed cell in a memory device, comprising:

a first programming part comprising: a first signal line for generating the redundancy signal; first enabling means for providing a first constant electric potential to the first signal line; and first programming cells coupled to address lines and controlling the electric potential of the first signal line; and a second programming part comprising: a second signal line for generating the redundancy signal; second enabling means for providing a second constant electric potential to the second signal line; and second programming cells coupled to address lines and controlling the electric potential of the second signal line, wherein the first and second enabling means comprise:

a first fuse having a first terminal coupled to a power supply voltage; and a logic circuit coupled to receive an enabling signal and also coupled to a second terminal of the first fuse, wherein the logic circuit generates a low level potential when the first fuse is coupled to the power supply and generates a high level potential when the first fuse is uncoupled from the power supply and the enabling signal is applied.

2. The spare decoder circuit according to claim 1, wherein the logic circuit comprises a NOR gate, an output signal of which is at a low level state irrespective of the enabling signal when the first fuse is coupled to the power supply, and the output signal of the NOR gate changes according to a state of the enabling signal when the first fuse is uncoupled from the power supply, the logic gate further comprising:

a resistive switching element coupled to the second terminal of the first fuse and coupling the second terminal of the first fuse to a reference potential in response to the enabling signal;

a first inverter coupled to the second terminal of the first fuse;

a first NMOS transistor having a gate coupled to an output terminal of the first inverter and drain and source terminals coupled between the second terminal of the first fuse and a reference electric potential, respectively;

a second inverter coupled to the output terminal of the first inverter;

the NOR gate having an input terminal coupled to an output terminal of the second inverter; and a third inverter having an input terminal coupled to receive the enabling signal and an output terminal coupled to another input terminal of the NOR gate.

3. The spare decoder circuit according to claim 1, wherein one of the first programming cells comprises:

a second fuse having a first terminal coupled to the power supply; and a logic circuit coupled to a second terminal of the second fuse and the address lines and generating a low level signal when an AI address is at a high state and an AIB address being a complement to the AI address is at a low state if the second fuse is in a coupled state, and generates a high level signal when the AI address is at the low state and the AIB address is at the high state when the second fuse is in the coupled state, and generates the high level signal when the AI address is at the high state and the AIB address is at the low state when the second fuse is in an uncoupled state, and generates the low level signal when the AI address is at the low state and the AIB address is at the high state when the second fuse is in the uncoupled state.

4. The spare decoder circuit according to claim 3, wherein the logic circuit of the first programming cell further comprises:

a resistive transistor circuit having a gate coupled to receive the enabling signal and a drain coupled to the second terminal of the second fuse;

a first inverter coupled to the second terminal of the second fuse;

a first NMOS transistor having a drain coupled to an output terminal of the first inverter and a gate coupled to one of the address lines;

a second inverter having an input terminal coupled to an output terminal of the first inverter;

a second NMOS transistor having a drain coupled to an output terminal of the second inverter and of a gate coupled to one of the address lines; and a third inverter having an input terminal coupled to sources of the first and second NMOS transistors.

5. The spare decoder circuit according to claim 4, wherein the resistive transistor circuit is at a low impedance when the enabling signal is in an active state and is at a high impedance when the enabling signal is in an inactive state, the resistive transistor circuit comprising:

a third NMOS transistor having a gate coupled to receive the enabling signal and a drain coupled to the second terminal of the second fuse; and a fourth NMOS transistor having a gate coupled to the power supply voltage and a drain and source coupled respectively between a source of the third NMOS transistor and a reference electric potential.

6. The space decoder circuit according to claim 1, wherein one of the second programming cells comprises:

a second fuse having a first terminal coupled to the power supply; and a logic circuit coupled to a second terminal of the second fuse and the address lines and generates a high level signal when an AI address is at a high state and an AIB address being a complement to the AI address is at a low state when the second fuse is in a coupled state, generates a low level signal when the AI address is at the low state and the AIB address is at the high state when the fuse is in the coupled state, generates the low level signal when the AI address is at the high state and the AIB address is at the low state when the second fuse is in an uncoupled state, and generates the high level signal when the AI address is at the low state and the AIB address is at the high state when the second fuse is in the uncoupled state.

7. The spare decoder circuit according to claim 6, wherein the logic circuit of the second programming cell further comprises:

a resistive transistor circuit having a gate coupled to receive the enabling signal and a drain coupled to the second terminal of the second fuse;

a first inverter coupled to the second terminal of the second fuse;

a first PMOS transistor having a drain coupled to an output terminal of the first inverter and a gate coupled to one of the address lines;

a second inverter having an input terminal coupled to an output terminal of the first inverter;

a second PMOS transistor having a drain coupled to an output terminal of the second inverter and a gate coupled to one of the address lines; and a third inverter having an input terminal coupled to sources of the first and second PMOS transistors.

8. The spare decoder circuit according to claim 7, wherein the resistive transistor circuit is at a low impedance when the enabling signal is in an active state and is at a high impedance when the enabling signal is in an inactive state, the resistive transistor circuit comprising:

a first NMOS transistor having a gate coupled to receive the enabling signal and a drain coupled to the second terminal of the second fuse; and a second NMOS transistor having a gate coupled to the power supply voltage and a drain and source coupled respectively between a source of the first NMOS transistor and a reference electric potential.

9. The spare decoder circuit according to claim 1, wherein one of the second programming cells comprises:

a second fuse having a first terminal coupled to the power supply voltage;

a first NMOS transistor having a gate coupled to receive an enabling signal and a drain coupled to a second terminal of the second fuse;

a second NMOS transistor having a gate coupled to the power supply voltage and a drain and source coupled respectively between a source of the first NMOS transistor and a reference electric potential;

a first inverter coupled to the second terminal of the second fuse;

a first PMOS transistor having a drain coupled to an output terminal of the first inverter and a gate coupled to a first address line;

a second inverter having an input terminal coupled to the output terminal of the first inverter;

a second PMOS transistor having a drain coupled to an output terminal of the second inverter and a gate coupled to a second address line; and a third inverter having an input terminal coupled to sources of the first and second PMOS transistors.

10. The spare decoder circuit according to claim 1, wherein one of the first programming cells comprises:

a second fuse having a first terminal coupled to the power supply voltage;

a first NMOS transistor having a gate coupled to receive an enabling signal and a drain coupled to a second terminal of the second fuse;

a second NMOS transistor having a gate coupled to the power supply voltage and a drain and source coupled respectively between a source of the first NMOS transistor and a reference electric potential;

a first inverter coupled to the second terminal of the second fuse;

a third NMOS transistor having a drain coupled to an output terminal of the first inverter and a gate coupled to a first address line;

a second inverter having an input terminal coupled to the output terminal of the first inverter;

a fourth NMOS transistor having a drain coupled to an output terminal of the second inverter and a gate coupled to a second address line; and a third inverter having an input terminal coupled to sources of the third and fourth NMOS transistors.

11. The spare decoder circuit according to claim 1, wherein one of the first programming cells comprises:

a second fuse having a first terminal coupled to the power supply voltage;

a first NMOS transistor having a gate coupled to receive an enabling signal and a drain coupled to the second terminal of a second fuse;

a second NMOS transistor having a gate coupled to the power supply voltage and a drain and source coupled respectively between a source of the first NMOS transistor and a reference electric potential;

a third NMOS transistor having a gate coupled to an AIB address signal of a repair address;

a fourth NMOS transistor having a gate coupled to an AI address signal of the repair address, wherein the AIB and AI address signals are complements;

a first inverter coupled to the second terminal of the second fuse;

a fifth NMOS transistor having a gate coupled to an output terminal of the first inverter and a source and drain coupled respectively between the second fuse and the reference electric potential;

a second inverter having an input terminal coupled to the output of the first inverter;

a first PMOS transistor having a gate coupled to an output terminal of the second inverter and a source coupled to the power supply voltage;

a third inverter having an input terminal coupled to the output terminal of the second inverter;

a second PMOS transistor having a gate coupled to an output terminal of the third inverter and a source coupled to the power supply voltage;

a sixth NMOS transistor having a gate coupled to a drain of the second PMOS transistor and a drain coupled to drains of the first PMOS transistor and the third NMOS transistor;

a seventh NMOS transistor having a gate coupled to the drain of the first PMOS transistor and a drain coupled to drains of the second PMOS transistor and the fourth NMOS transistor; and a fourth inverter for receiving output signals from sources of the third NMOS transistor and the fourth NMOS transistor as an input.

12. A method for coding an address of a failed cell in a memory device using a spare decoder circuit to generate a redundancy signal to access a redundancy cell, the spare decoder circuit having a first programming part including a first signal line for generating the redundancy signal, first enabling circuit for providing a constant electric potential to the first signal line, and first programming cells coupled to address lines and controlling the electric potential of the first signal line, and a second programming part including a second signal line for generating the redundancy signal, second enabling circuit for providing a constant electric potential to the second signal line, and second programming cells coupled to the address lines and controlling the electric potential of the second signal line, the method comprising the steps of:

cutting a fuse of the second enabling circuit of the second programming part and a corresponding fuse of the second programming cells when there are more high bits in the failed address than low bits; and cutting a fuse of the first enabling circuit of the first programming part and a corresponding fuse of the first programming cells when there are fewer high bits in the failed address than low bits;

wherein, either the second programming part or the first programming part is coded with the failed address depending upon the number of high and low bits in the failed address.

13. The spare decoder circuit of claim 1, wherein spare decoder circuit is responsive to a row address strobe signal and repairs a row address.

14. The spare decoder circuit of claim 1, wherein spare decoder circuit is responsive to a column address strobe signal and repairs a column address.

15. The spare decoder circuit of claim 1, wherein the first programming part is programmed with the address of a first failed address, and wherein the second programming part is programmed with the address of a second failed address.

16. The method of claim 12, further comprising the steps of determining a failed address, and determining the number of high and low bits in the failed address, wherein the fuse of the first and second programming cells are selectively uncoupled depending upon the number of high and low bits in the failed address.

17. The method of claim 12, wherein spare decoder circuit is responsive to a row address strobe signal and repairs a row address.

18. The method of claim 12, wherein spare decoder circuit is responsive to a column address strobe signal and repairs a column address.

19. The method of claim 12, wherein the first programming part is programmed with the address of a first failed address, and wherein the second programming part is programmed with the address of a second failed address.

* * * * *